(12) United States Patent
Ha et al.

(10) Patent No.: US 7,804,703 B2
(45) Date of Patent: Sep. 28, 2010

(54) PHASE CHANGE MEMORY DEVICE HAVING SCHOTTKY DIODE AND METHOD OF FABRICATING THE SAME

(75) Inventors: Dae-Won Ha, Seoul (KR); Gi-Tae Jeong, Seoul (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 178 days.

(21) Appl. No.: 12/120,583

(22) Filed: May 14, 2008

(65) Prior Publication Data
US 2009/0034319 A1  Feb. 5, 2009

(30) Foreign Application Priority Data
Jul. 31, 2007  (KR) .................. 10-2007-0077158

(51) Int. Cl.
*G11C 11/00* (2006.01)
(52) U.S. Cl. .................. 365/148; 365/163
(58) Field of Classification Search ............ 365/148, 365/163, 175
See application file for complete search history.

(56) References Cited

U.S. PATENT DOCUMENTS 7,009,208 B2  3/2006  Aratani et al.

| | | | |
|---|---|---|---|
| 2006/0186483 A1* | 8/2006 | Cho et al. | 257/390 |
| 2008/0002457 A1 | 1/2008 | Toda et al. | |
| 2008/0106931 A1* | 5/2008 | Toda | 365/163 |
| 2009/0027938 A1* | 1/2009 | Wells | 365/51 |

FOREIGN PATENT DOCUMENTS

| | | |
|---|---|---|
| KR | 2004-0089527 | 10/2004 |
| KR | 2006-0094424 | 8/2006 |
| KR | 2006-0133394 | 12/2006 |
| WO | WO 03/085675 | 10/2003 |

OTHER PUBLICATIONS

English language abstract of Korean Publication No. 2006-0094424.
English language abstract of Korean Publication No. 2006-0133394.

* cited by examiner

*Primary Examiner*—Vu A Le
(74) *Attorney, Agent, or Firm*—Muir Patent Consulting, PLLC

(57) ABSTRACT

A phase change memory device includes wordlines extending along a direction on a semiconductor substrate. Low concentration semiconductor patterns are disposed on the wordlines. Node electrodes are disposed on the low concentration semiconductor patterns. Schottky diodes are disposed between the low concentration semiconductor patterns and the node electrodes. Phase change resistors are disposed on the node electrodes.

18 Claims, 8 Drawing Sheets

PHASE CHANGE MEMORY DEVICE HAVING SCHOTTKY DIODE AND METHOD OF FABRICATING THE SAME

CROSS-REFERENCE TO RELATED PATENT APPLICATION

This application claims the benefit of foreign priority to Korean Patent Application No. 10-2007-0077158, filed on Jul. 31, 2007, the disclosure of which is incorporated herein in its entirety by reference.

BACKGROUND

1. Field of Invention

Embodiments of the present invention relate to semiconductor memory devices and methods of fabricating the same, and more particularly, to a semiconductor device such as a phase change memory device having a diode and a method of fabricating the same.

2. Description of the Related Art

A phase change memory device is a type of memory device using resistance difference caused by phase change within a phase change material, and is a nonvolatile memory device. One unitary cell of such a phase change memory device includes a switching device and a phase change resistor electrically connected to the switching device.

The switching device may be a metal-oxide semiconductor (MOS) transistor. If the switching device is a MOS transistor, a large program current of at least several mA is necessary to program a unitary cell of the phase change memory device. Moreover, the program current must flow through the MOS transistor. Therefore, there is a limit in reducing the area occupied by the MOS transistor. Accordingly, if a MOS transistor is used as the switching device, there may be a limit in improving integration of the phase change memory device.

Instead of the MOS transistor, a vertical PN diode may be used as the switching device of a unitary cell to solve the aforementioned problems. However, since the threshold voltage of the vertical PN diode is rather high (between 0.7V and 0.8V), it is difficult to reduce the operating voltage of the vertical PN diode. Also, since the program current is carried by holes in the vertical PN diode, the on-current of the PN diode is low. As a result, a programming efficiency is relatively poor when the vertical PN diode is used as the switching device.

SUMMARY

Embodiments of the present invention provide a semiconductor memory device such as a phase change memory device with a low operating voltage and improved programming efficiency.

One embodiment exemplarily described herein can be generally characterized as a semiconductor memory device that includes a wordline extending along a direction on a semiconductor substrate; a first semiconductor pattern disposed on the wordline; a node electrode disposed on the first semiconductor pattern; a Schottky diode formed between the first semiconductor pattern and the node electrode; and a phase change resistor disposed on the node electrode.

One embodiment exemplarily described herein can be generally characterized as a semiconductor device that includes a semiconductor substrate including a cell array region and a peripheral circuit region; a memory device disposed within the cell array region; a transistor disposed within the peripheral circuit region; a wordline extending disposed within the cell array region; a first contact plug disposed within the peripheral circuit region and electrically connected to the transistor; a plurality of first semiconductor patterns, wherein one of the plurality of first semiconductor patterns is disposed on the wordline and another one of the plurality of first semiconductor patterns is disposed on the contact plug; a node electrode disposed within the cell array region and on the first semiconductor pattern; a Schottky diode formed between the first semiconductor pattern and the node electrode; and a phase change resistor disposed within the cell array region and on the node electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Exemplary embodiments of the present invention will now be described more fully with reference to the accompanying drawings. These embodiments may, however, be realized in different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like numbers refer to like elements throughout.

Figure 1:
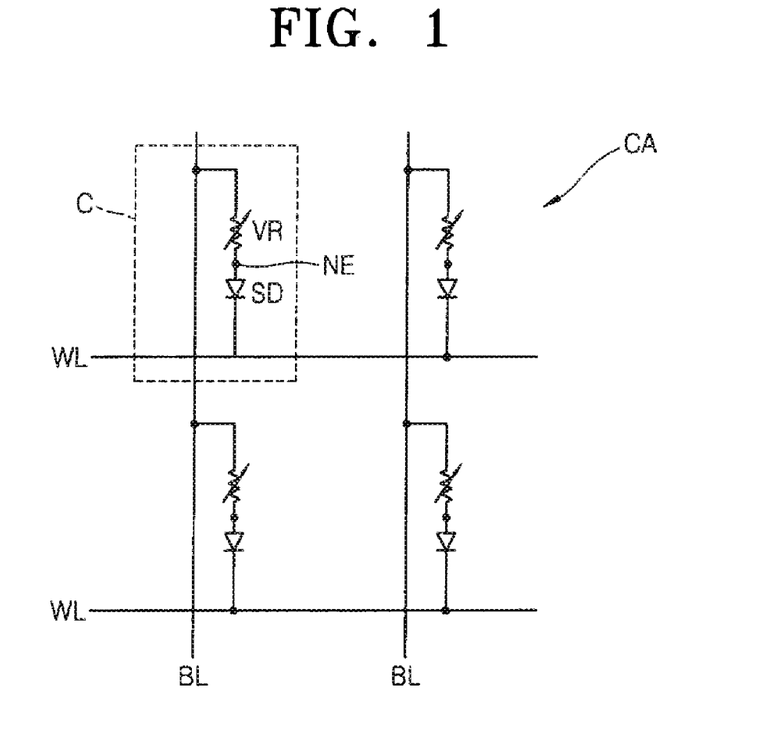
FIG. 1 is an equivalent circuit diagram of a cell array region of a semiconductor memory device, according to an embodiment of the present invention.

FIG. 1 is an equivalent circuit diagram of a cell array region of a semiconductor memory device (e.g., a phase change memory device), according to an embodiment of the present invention.

Referring to FIG. 1, a cell array CA of the phase change memory device may include a plurality of wordlines (WL) and a plurality of bitlines (BL) crossing the plurality of wordlines WL. A phase change memory cell C may be disposed at locations where the BL and the WL cross each other. Each of the phase change memory cells C may include a phase change resistor (VR) and a Schottky diode (SD). One end of the phase change resistor VR may be electrically connected to a bit line BL while another end may be electrically connected to an anode of the Schottky diode SD. A cathode of the Schottky diode SD may be electrically connected to one of the WL. A node electrode (NE), which is a node between the phase change resistor VR and the Schottky diode SD, may function not only as the anode of the Schottky diode SD, but also as a bottom electrode of the phase change resistor VR.

Figure 2:
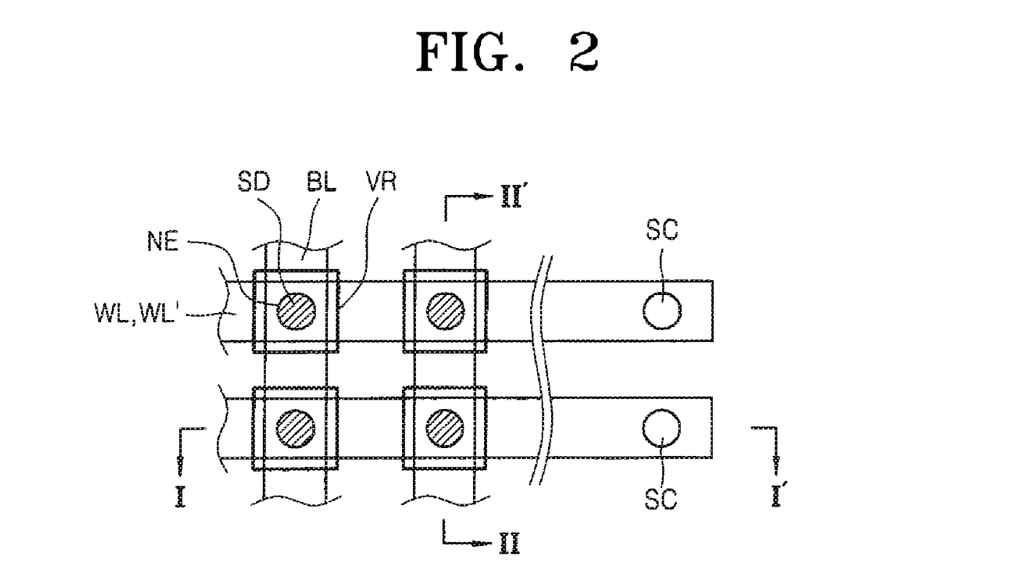
FIG. 2 is a layout partially illustrating the cell array region of the semiconductor memory device of FIG. 1.

FIG. 2 is a layout partially illustrating the cell array region of the semiconductor memory device of FIG. 1. FIGS. 3A through 3F are cross-sectional views of the cell array region taken along lines I-I' and II-II' of FIG. 2, and cross-sectional views of a peripheral circuit region, to show a method of fabricating the semiconductor memory device of FIG. 1, according to an embodiment of the present invention.

Figure 3A:
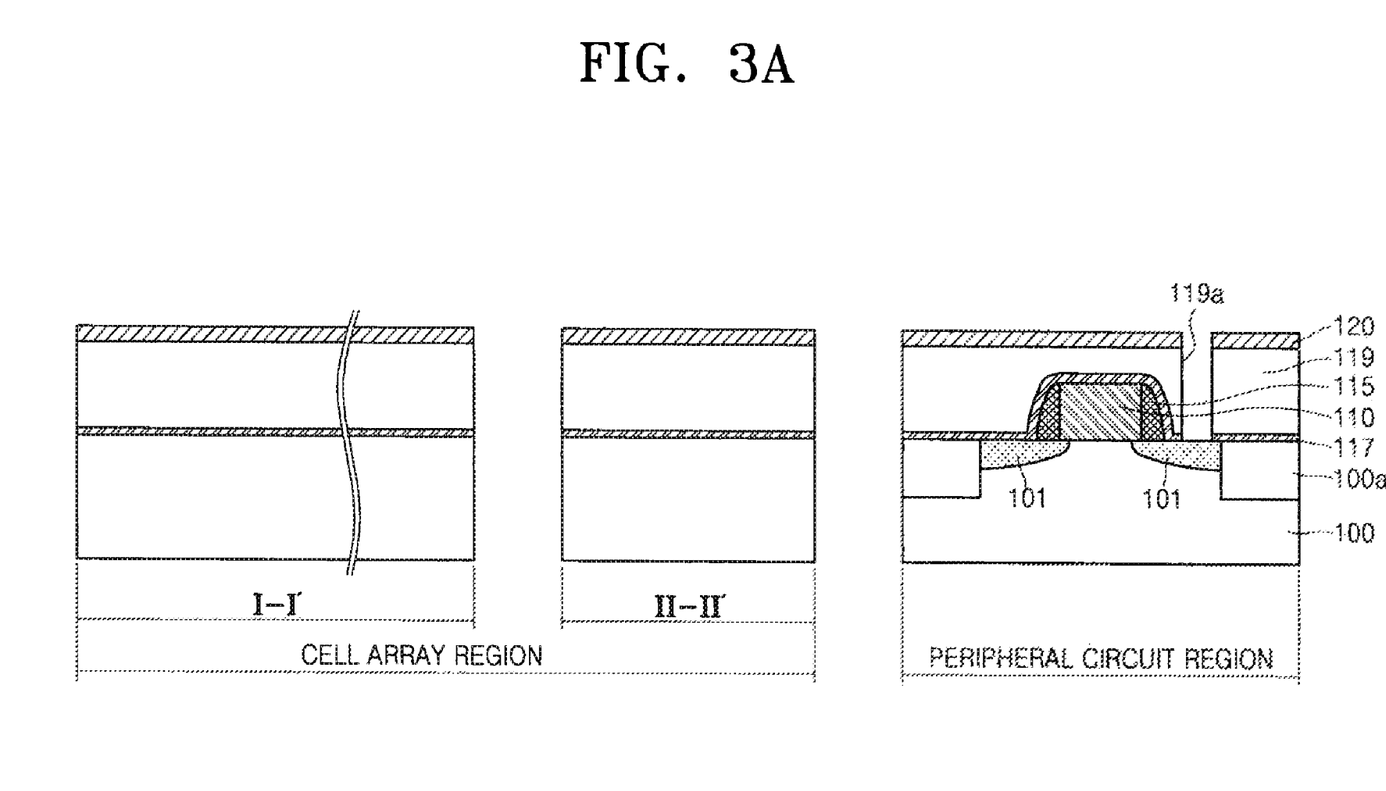
FIGS. 3A through 3F are cross-sectional views of the cell array region taken along lines I-I' and II-II' of FIG. 2, and cross-sectional views of a peripheral circuit region, to show a method of fabricating the semiconductor memory device of FIG. 1, according to an embodiment of the present invention.

Referring to FIG. 3A, a semiconductor substrate 100 having a cell array region and a peripheral circuit region is provided. A device isolation layer 100a may be formed in the peripheral circuit region to define an active region. A gate pattern 110 may be formed on the active region, and source/drain regions 101 may be formed in the active region using the gate pattern 110 as an ion implantation mask. Accordingly, the gate pattern 110 and the source/drain regions 101 may be characterized as a transistor. Insulation spacers 115 may be formed on side surfaces of the gate pattern 110. In one embodiment, the insulation spacers 115 may include silicon nitride material, or the like. A bottom etch stop layer 117 may be formed on the gate pattern 110, the insulation spacers 115, and the semiconductor substrate 100. In one embodiment, the bottom etch stop layer 117 may include silicon nitride material, or the like.

A first interlayer insulation layer 119 may be formed on the bottom etch-stop layer 117. The first interlayer insulation layer 119 may be etched to be planarized. A top etch-stop layer 120 may be stacked on the planarized first interlayer insulation layer 119. A first circuit contact hole 119a, exposing the bottom etch-stop layer 117, may be formed in the top etch-stop layer 120 and the first interlayer insulation layer 119 by etching the top etch-stop layer 120 and the first interlayer insulation layer 119 until the bottom etch-stop layer 117 is exposed. One of the source/drain regions 101 may be exposed through the first circuit contact hole 119a by etching the bottom etch-stop layer 117. In another embodiment, the first circuit contact hole 119a may be formed to expose the gate pattern 110 instead of one of the source/drain regions 101.

Figure 3B:
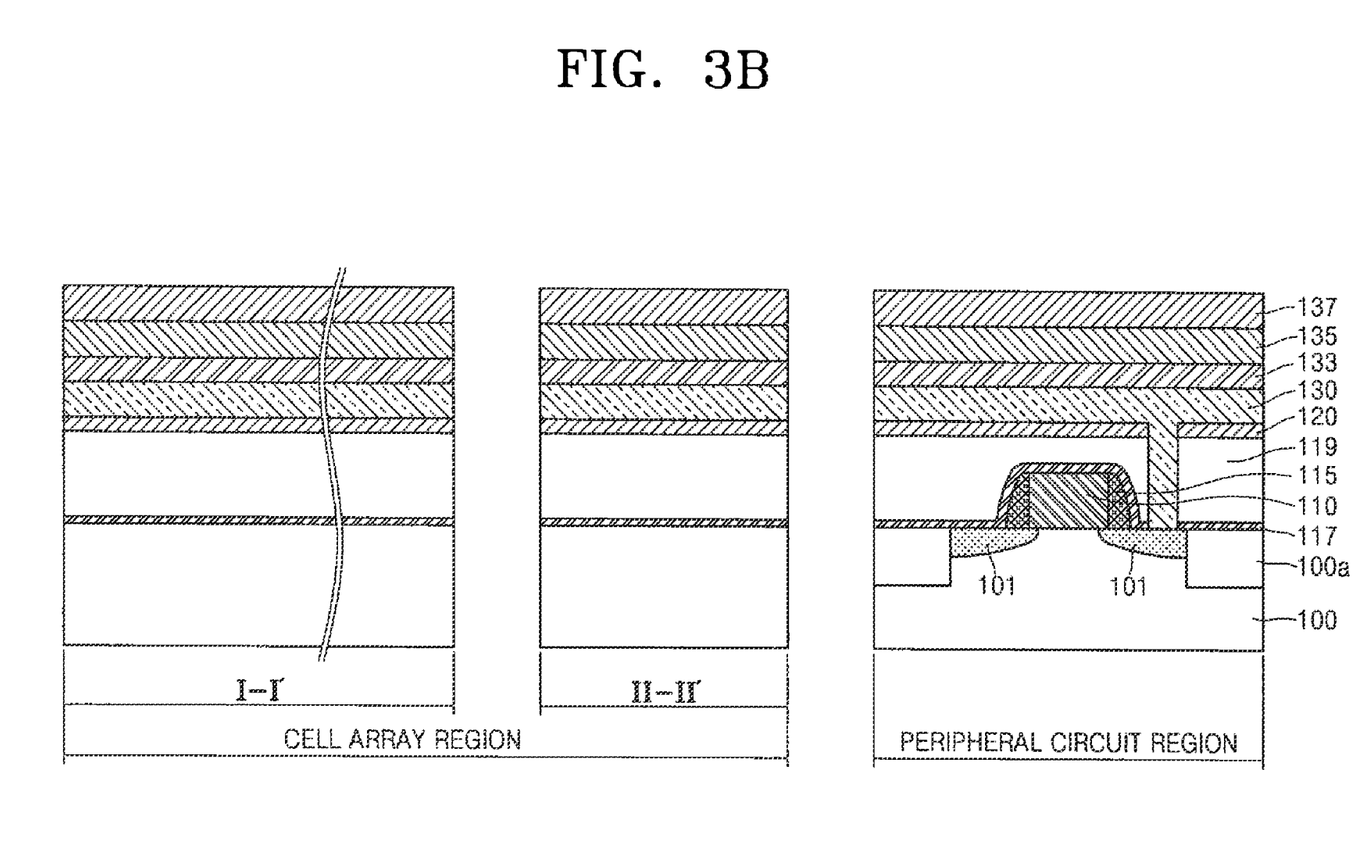

Referring to FIG. 3B, a wordline conductive layer 130 is formed on the top etch-stop layer 120. In one embodiment, the wordline conductive layer 130 may be a conductive layer containing a metal, a metal silicide, a metal nitride, or the like or a combination thereof. For example, the wordline conductive layer 130 may include a material such as titanium, cobalt, tungsten, molybdenum, tantalum, titanium silicide, cobalt silicide, tungsten silicide, molybdenum silicide, tantalum silicide, titanium nitride, cobalt nitride, tungsten nitride, molybdenum nitride, tantalum nitride, or the like or a combination thereof. Prior to forming the wordline conductive layer 130, a barrier conductive layer (not shown) may be formed on the top etch-stop layer 120. The wordline conductive layer 130 may fill the first circuit contact hole 119a.

A high concentration semiconductor layer 133 and a low concentration semiconductor layer 135 may be sequentially formed on the wordline conductive layer 130.

In one embodiment, the high concentration semiconductor layer 133 is a semiconductor layer doped with n-type dopants, and may have a sufficient dopant concentration to achieve ohmic contact with the wordline conductive layer 130. For example, the dopant concentration in the high concentration semiconductor layer 133 may be between about $1E19$ $cm^{-3}$ and about $1E21$ $cm^{-3}$, e.g., between about $5E19$ $cm^{-3}$ and about $1E21$ $cm^{-3}$. The high concentration semiconductor layer 133 may be doped with dopants by using an in-situ doping method. The thickness of the high concentration semiconductor layer 133 may be between about 500 Å and about 2000 Å. The high concentration semiconductor layer 133 may include a polycrystalline layer, and may include a material such as silicon (Si), silicon-germanium (SiGe), silicon-carbide (SiC), or the like or a combination thereof.

In one embodiment, the low concentration semiconductor layer 135 may be a semiconductor layer doped with n-type dopants. In one embodiment, the low concentration semiconductor layer 135 may be doped using an in-situ doping method like the high concentration semiconductor layer 133, but have a lower dopant concentration than that of the high concentration semiconductor layer 133. In another embodiment, the low concentration semiconductor layer 135 may be initially deposited as an undoped semiconductor layer into which n-type dopants may be introduced (e.g., by ion-implantation). The dopant concentration of the low concentration semiconductor layer 135 should be sufficiently low so that a Schottky diode SD may be formed at the interface between the low concentration semiconductor layer 135 and a subsequently formed node electrode (NE) when the low concentration semiconductor layer 135 contacts the node electrode NE. For example, the n-type dopant concentration in the low concentration semiconductor layer 135 may be about $1E10$ $cm^{-3}$ or more, and less than about $1E19$ $cm^{-3}$, e.g., between about $1E17$ $cm^{-3}$ and $1E18$ $cm^{-3}$. The thickness of the low concentration semiconductor layer 135 may be between about 300 Å and about 5000 Å. The low concentration semiconductor layer 135 may include a polycrystalline layer, and may include a material such as Si, SiGe, SiC, or a combination thereof.

A hard mask layer 137 may be stacked on the low concentration semiconductor layer 135. In one embodiment, the hard mask layer 137 may include silicon nitride material, or the like.

Thereafter, an activation annealing process is performed on the semiconductor substrate 100 to activate the dopants with which the semiconductor layers 133 and 135 are doped. The activation annealing process may be performed at a temperature between about 950° C. and about 1100° C. In one embodiment, a furnace anneal, a rapid thermal anneal (RTA), a spike anneal, a laser anneal, a flash anneal, or the like or a combination thereof may be used as the activation annealing process.

Figure 3C:
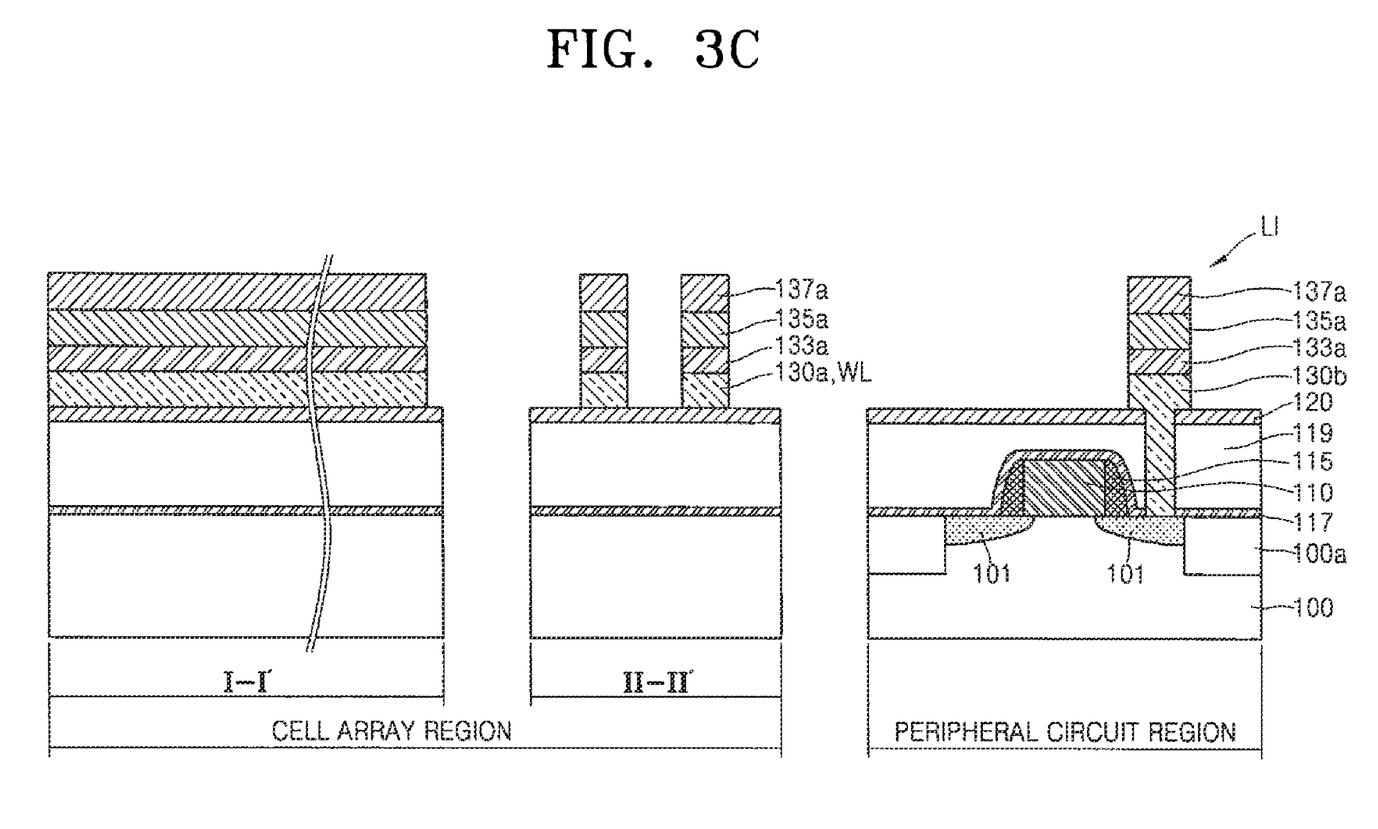

Referring to FIGS. 2 and 3C, a photoresist pattern (not shown) is formed on the hard mask layer 137, and a hard mask pattern 137a is formed by etching the hard mask layer 137 by using the photoresist pattern as an etch mask. Thereafter, the low concentration semiconductor layer 135, the high concentration semiconductor layer 133, and the wordline conductive layer 130 are etched in sequence by using the hard mask pattern 137a as an etch mask until the top etch-stop layer 120 is exposed. As a result, word lines (WL) 130a extending along a first direction are formed on the top etch-stop layer 120 in the cell array region, and a first circuit contact plug 130b filling the first circuit contact hole 119a is formed on the peripheral circuit region. Also, first high concentration semiconductor patterns 133a and low concentration semiconductor patterns 135a may be sequentially stacked on the WL 130a and the first circuit contact plug 130b.

Since the WL 130a are formed above the first interlayer insulation layer 119, a junction leakage current and a junction capacitance between the semiconductor substrate 100 and a dopant region may be eliminated in contrast to the case where the WL 130a are formed as the dopant region in the semiconductor substrate 100.

The first high concentration semiconductor patterns 133a and the low concentration semiconductor patterns 135a formed on the cell array region may extend along the WL 130a. Accordingly, the current flowing along the WL 130a may also flow within the first high concentration semiconductor patterns 133a and low concentration semiconductor patterns 135a, especially within the first high concentration semiconductor patterns 133a, so that voltage drop across the WL 130a may be reduced. As a result, more cells can be connected to each of the WL 130a and the overall integration of phase change memory devices can be improved.

The first circuit contact plug 130b, the first high concentration semiconductor patterns 133a and the low concentration semiconductor patterns 135a, which are sequentially stacked on the peripheral circuit region, can function as local interconnections (LI).

Figure 3D:
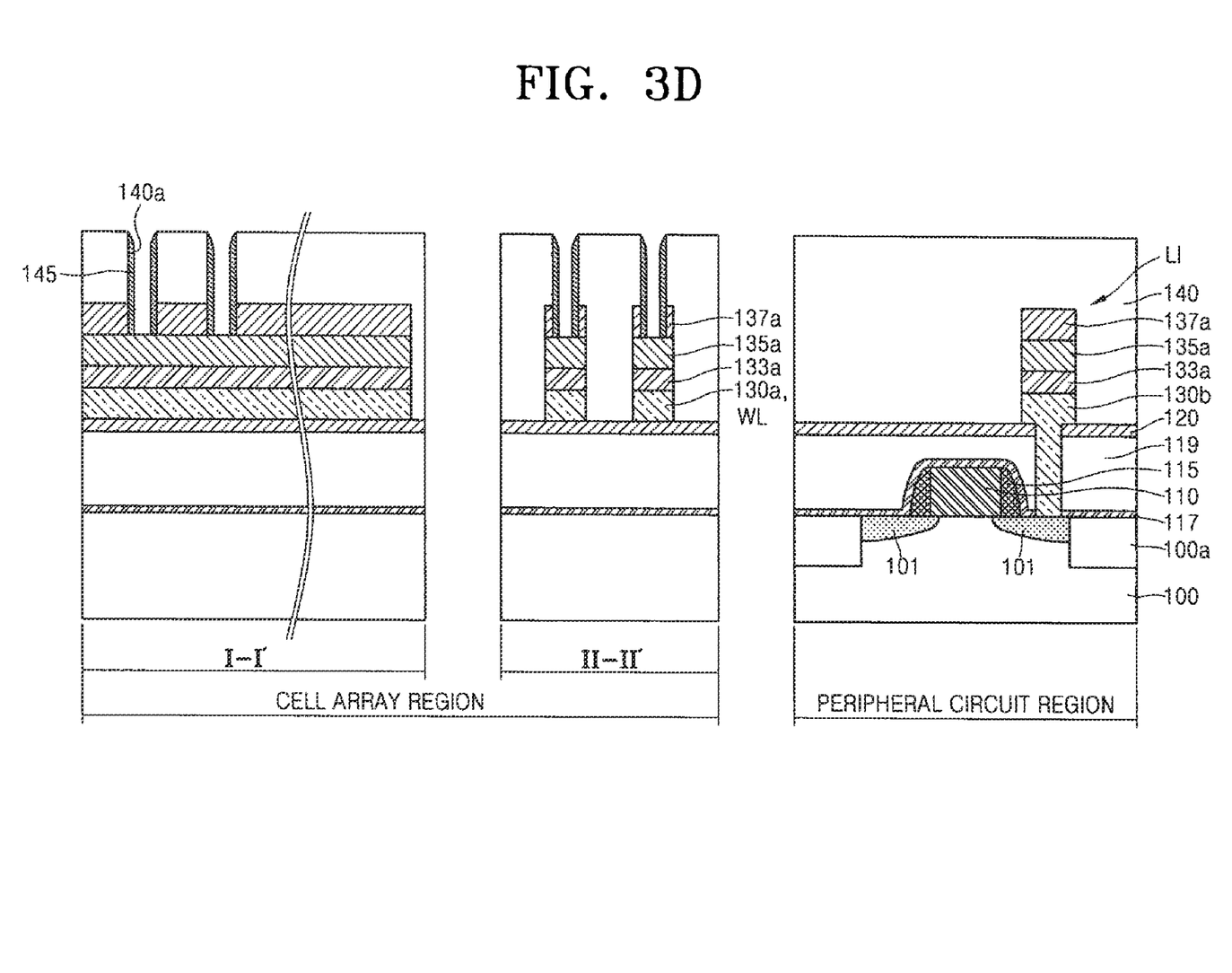

Referring to FIG. 3D, a second interlayer insulation layer 140 may be formed on the low concentration semiconductor patterns 135a. In one embodiment, the second interlayer insulation layer 140 may include silicon oxide material, or the like. Node contact holes 140a may be formed in the second interlayer insulation layer 140. The node contact holes 140a may penetrate the hard mask pattern 137a and expose portions of the top surfaces of the low concentration semiconductor patterns 135a.

Insulation spacers 145 may be formed on inner side surfaces of the node contact holes 140a. In another embodiment, however, formation of the insulation spacers 145 may be omitted. The insulation spacers 145 may be formed as insulation layers having an etching selectivity with the second interlayer insulation layer 140. For example, if the second interlayer insulation layer 140 includes silicon oxide material, the insulation spacers 145 may include silicon nitride, silicon oxynitride, or the like or a combination thereof.

Figure 3E:
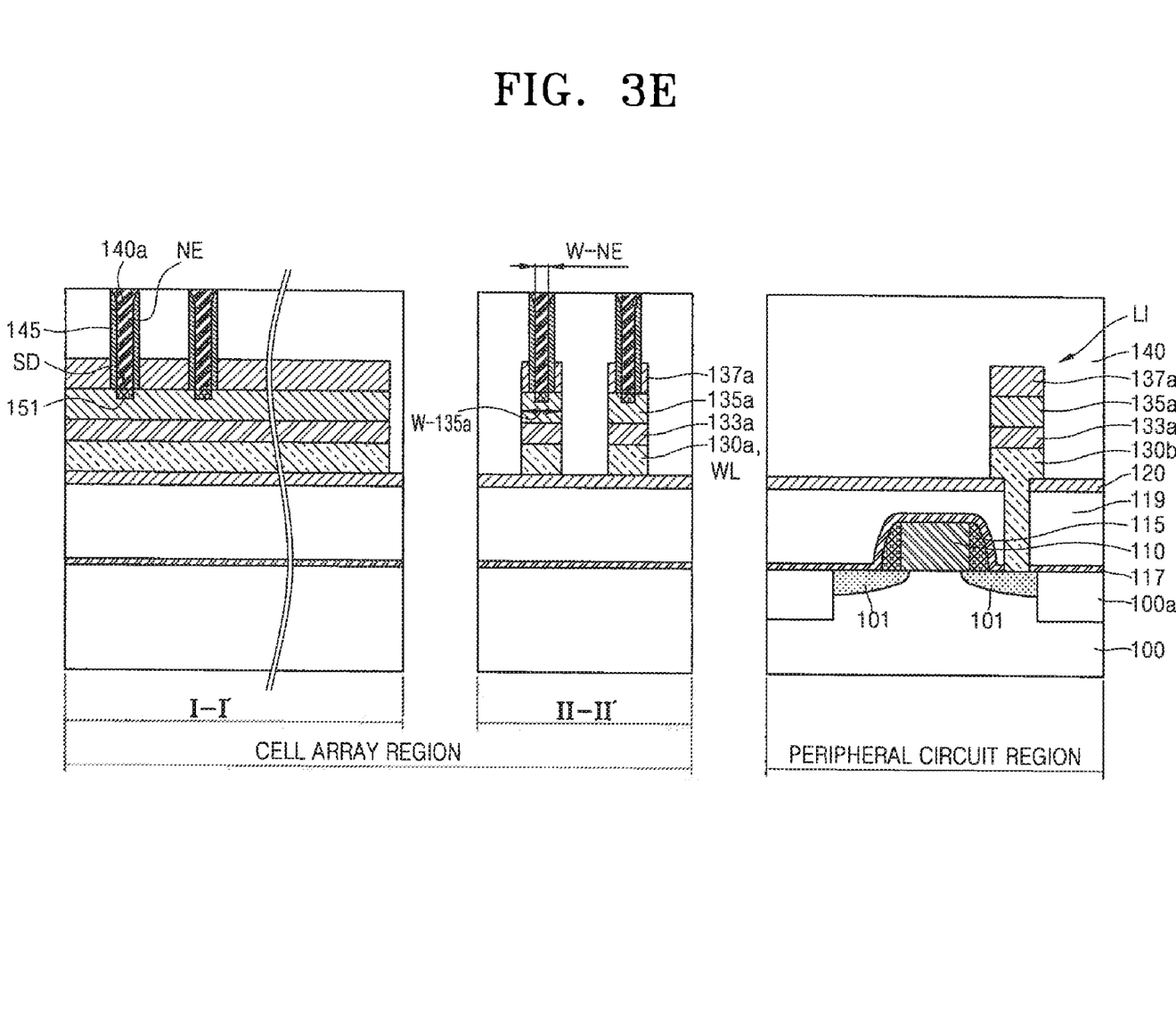

Referring to FIGS. 2 and 3E, a node conductive layer (not shown) is formed to fill the node contact holes 140a. The node conductive layer may include a conductive layer containing a high melting point metal, metal silicide, or the like or a combination thereof. For example, the node conductive layer may include titanium, tungsten, molybdenum, tantalum, titanium-silicide, tungsten-silicide, molybdenum-silicide, tantalum-silicide, or the like or a combination thereof.

When the node conductive layer contains a metal, native oxides that are formed on the top surface of the low concentration semiconductor patterns 135a exposed in the node contact hole 140a may be removed in situ with the forming of the node conductive layer. Therefore, an additional process of removing native oxides may be omitted. To omit the process of removing native oxides, the node conductive layer may be formed using, for example, a sputtering method.

A plurality of node electrodes NE, connected to the low concentration semiconductor patterns 135a, are formed in the node contact holes 140a by planarization-etching the node conductive layer. Thus, Schottky diodes SD may be formed on interfaces between the node electrodes NE and the low concentration semiconductor patterns 135a. A Schottky diode SD can reduce the operating voltage of a phase change memory device since the threshold voltage of the Schottky diode SD is lower than the threshold voltage of a PN diode. Also, since the current is carried by electrons in the Schottky diode SD instead of by holes as in the PN diode, the on-current of the Schottky diode SD is higher than the on-current of the PN diode. As a result, the Schottky diode SD can improve the programming efficiency.

The widths of the node electrodes (W-NE), may be smaller than the widths of the low concentration semiconductor patterns (W-135a). To make the widths of the node electrodes W-NE smaller than the widths of the low concentration semiconductor patterns W-135a, the node contact holes 140a may be formed such that the widths of the node contact holes 140a are smaller than the widths of the low concentration semiconductor patterns W-135a. Accordingly, the widths of the Schottky diodes SD, which are formed on the interfaces between the node electrodes NE and the low concentration semiconductor patterns 135a, may also be smaller than the widths of the low concentration semiconductor patterns W-135a. Accordingly, the off-current of the Schottky diodes SD may be reduced. Although the on-currents of the Schottky diodes SD may also be reduced, the reduction may not be significant since the initial on-currents of the Schottky diodes SD are very high. Moreover, in embodiments where the insulation spacers 145 are formed, the widths of the node electrodes W-NE can be reduced further, and thus the off-currents of the Schottky diodes SD can be further reduced.

Metal-silicide layers 151 may be formed in the low concentration semiconductor patterns 135a by subjecting the semiconductor substrate 100 on which the node electrodes NE are formed to a silicidation heat treatment. The metal-silicide layers 151 can reduce the interfacial resistances between the node electrodes NE and the low concentration semiconductor patterns 135a. The silicidation heat treatment may be performed at a temperature between about 350° C. and about 550° C.

Figure 3F:
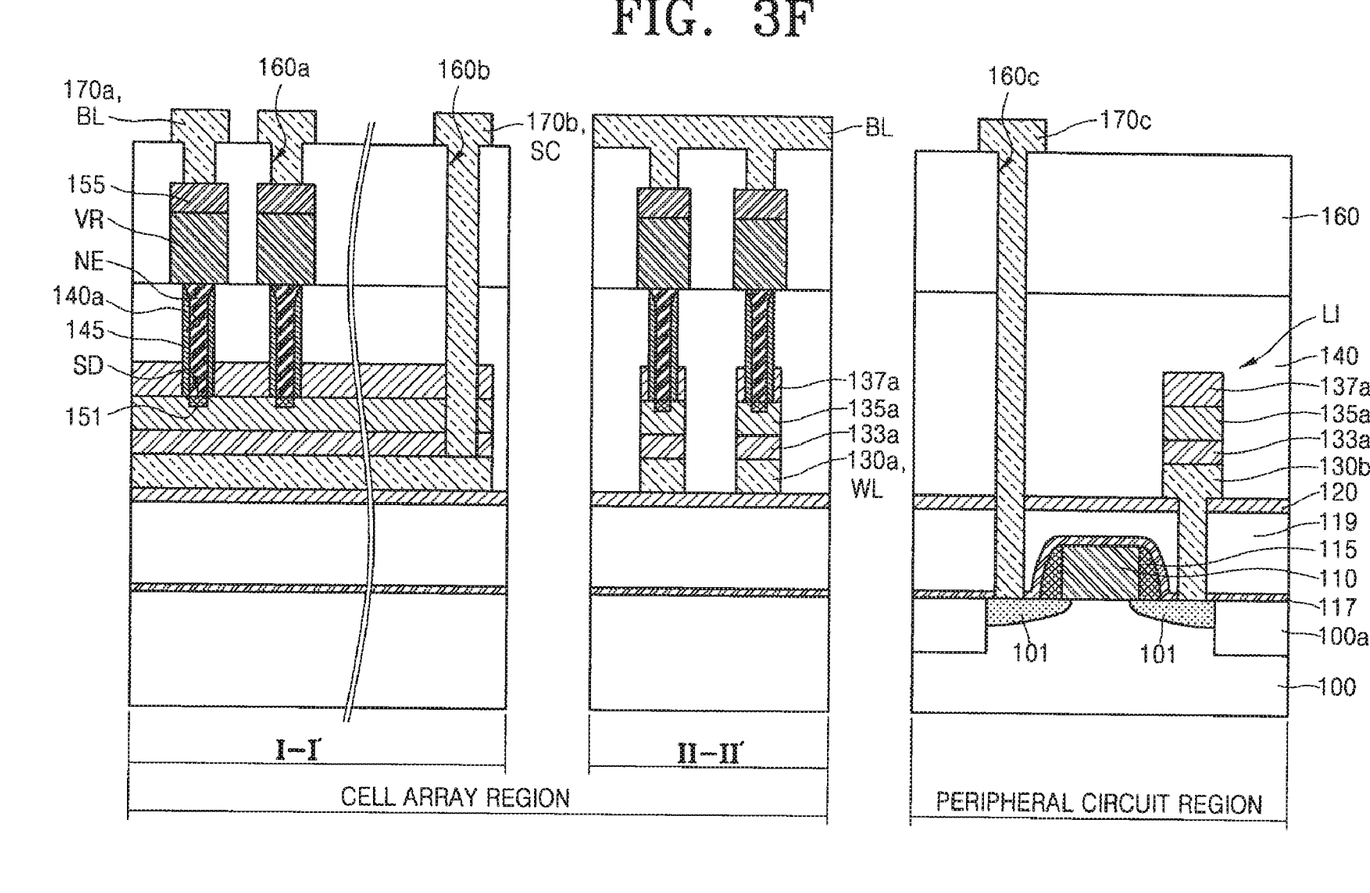

Referring to FIGS. 2 and 3F, a phase change material layer (not shown) and a top electrode layer (not shown) may be sequentially formed on the node electrodes NE. The phase change material layer may be a chalcogenide layer including a material such as a Ge—Sb—Te alloy, or the like. The top electrode layer may be a conductive layer including a material such as titanium nitride, or the like. By patterning the top electrode layer and the phase change material layer successively, phase change resistors VR, which cover corresponding ones of the node electrodes NE, and top electrodes 155, which cover corresponding ones of the phase change resistors VR, may be formed.

The node electrodes NE, connected to the bottoms of corresponding ones of the phase change resistors VR, can function as the bottom electrodes of the phase change resistors VR.

A third interlayer insulation layer 160 is formed on the top electrodes 155. By patterning the third interlayer insulation layer 160, via holes 160a exposing portions of the top electrodes 155, signal contact holes 160b exposing single ends of the WL, and second circuit contact holes 160c exposing the other of the source/drain regions 101 in the peripheral circuit region may be formed. A bitline conductive layer (not shown) may be formed on the third interlayer insulation layer 160 to fill the via holes 160a, the signal contact holes 160b and the second circuit contact holes 160c. By patterning the bitline conductive layer, bit lines (BL) 170a, signal contact (SC) plugs 170b, and second circuit contact plugs 170c may be formed. The BL 170a may fill the via holes 160a and may extend along a second direction (e.g., substantially perpendicular to the first direction) on the third interlayer insulation layer 160 to cross over the WL 130a. Through the signal contact plugs SC 170b, electric signals may be applied to the WL 130a.

Figure 4:
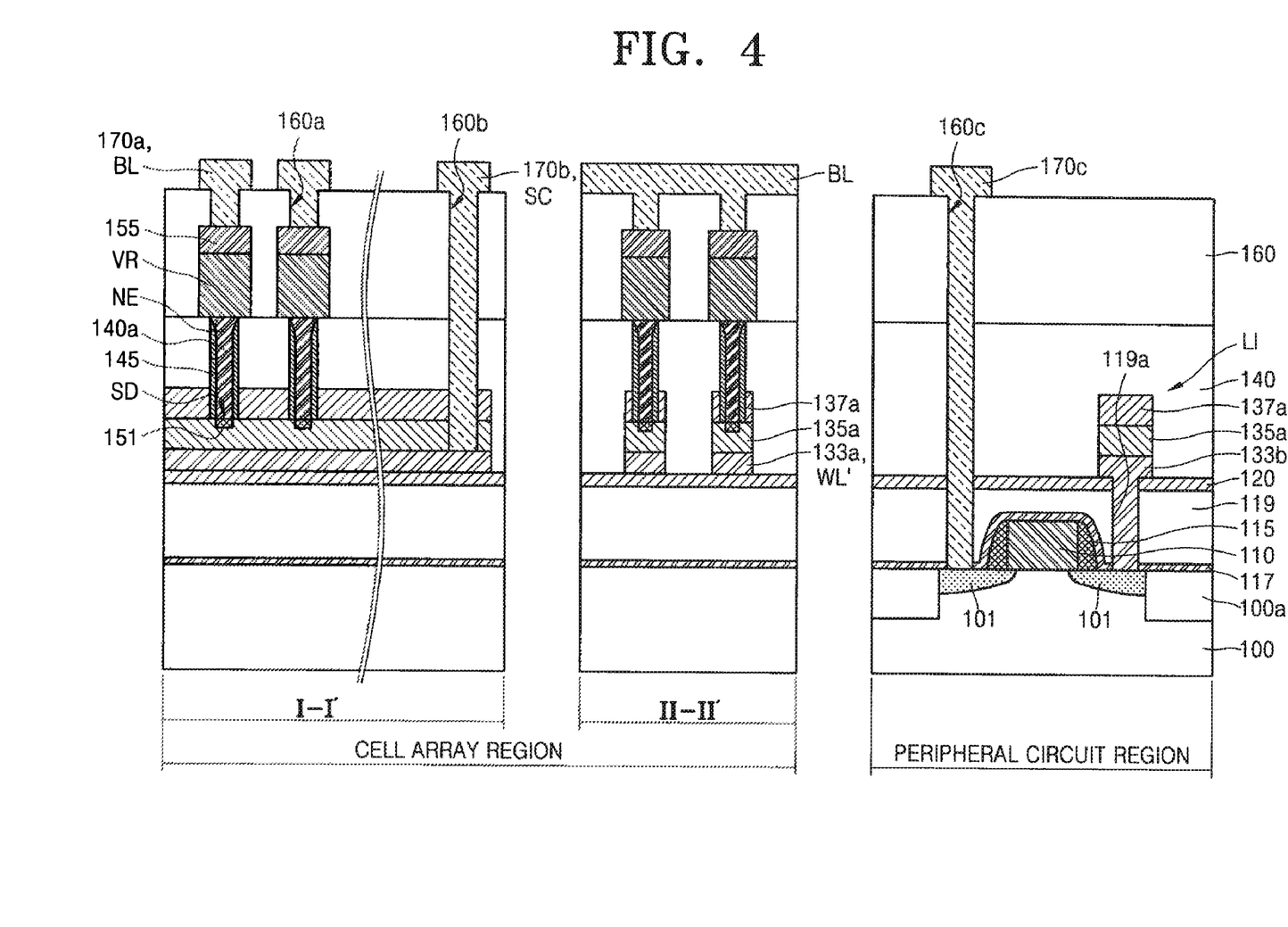
FIG. 4 is a cross-sectional view of a cell array region taken along lines I-I' and II-II' of FIG. 2, and a peripheral circuit region of the semiconductor memory device, according to another embodiment of the present invention.

FIG. 4 is a cross-sectional view of a cell array region taken along lines I-I' and II-II' of FIG. 2, and a peripheral circuit region of the semiconductor memory device, according to another embodiment of the present invention.

The present embodiment is similar to the embodiment described with reference to FIGS. 3A through 3F with a few exceptions as described below.

Referring to FIGS. 2 and 4, first high concentration semiconductor patterns 133a and second high concentration semiconductor patterns 133b are formed on a top etch-stop layer 120. The first high concentration semiconductor patterns 133a may be wordlines (WL') in a cell array region. The second high concentration semiconductor patterns 133b may be disposed in the first circuit contact hole 119a formed in the first interlayer insulation layer 119, and may be connected to one of the source/drain regions 101.

Low concentration semiconductor patterns 135a may be disposed on the WL' 133a and may extend along the WL' 133a.

The low concentration semiconductor patterns 135a and the WL' 133a may be formed by sequentially stacking a high concentration semiconductor layer (not shown) and a low concentration semiconductor layer (not shown) on the top etch-stop layer 120, followed by sequentially patterning the low concentration semiconductor layer and the high concentration semiconductor layer. In one embodiment, the high and low concentration semiconductor layers may be formed as described with respect to FIG. 3B.

Embodiments of the present invention may be practiced in many ways. What follows is a non-limiting description of some exemplary embodiments of the present invention.

According to one embodiment of the present invention, there is provided a semiconductor memory device. The semiconductor memory device includes a wordline extending along a first direction on a semiconductor substrate. A first semiconductor pattern is disposed on the wordline. A node electrode is disposed between the low concentration semiconductor pattern and the node electrode. A phase change resistor is disposed on the node electrode.

The wordline may contain a metal and a second semiconductor pattern may be disposed between the first semiconductor pattern and the wordline. The second semiconductor pattern and the first semiconductor pattern may extend along the wordline.

The first semiconductor pattern may comprise a first concentration of dopant and the second semiconductor pattern may comprise a second concentration of dopant higher than the first concentration of dopant.

The wordline may be a second semiconductor pattern. In this case, the first semiconductor pattern may extend along the second semiconductor pattern.

A first interlayer insulation layer may be disposed on the semiconductor substrate that is below the wordline.

The width of the node electrode may be smaller than the width of the first semiconductor pattern.

A second interlayer insulation layer, which covers the first semiconductor pattern and includes a node contact hole exposing a portion of the top surface of the low concentration semiconductor pattern, may be disposed on the first semiconductor pattern. The node electrode may be placed in the node contact hole. An insulation spacer surrounding the node electrode may be disposed on inner side surfaces of the node contact hole.

According to one embodiment of the present invention, there is provided a semiconductor device that includes a semiconductor substrate. The semiconductor substrate includes a cell array region and a peripheral circuit region. A memory device is disposed within the cell array region and a transistor is disposed within the peripheral circuit region. A wordline is disposed within the cell array region. A first contact plug is disposed within the peripheral circuit region and electrically connected to the transistor. A plurality of first semiconductor patterns are provided, wherein one of the plurality of first semiconductor patterns is disposed on the wordline and another one of the plurality of first semiconductor patterns is disposed on the contact plug. A node electrode is disposed within the cell array region and on the one of the plurality of first semiconductor patterns. A Schottky diode is formed between the one of the plurality of first semiconductor patterns and the node electrode. A phase change resistor is disposed within the cell array region and on the node electrode.

The wordline and first contact plug may contain a metal and a plurality of second semiconductor patterns may be disposed between the plurality of first semiconductor patterns and corresponding ones of the wordline and contact plug.

The plurality of first semiconductor patterns may comprise a first concentration of dopant and the plurality of second semiconductor patterns may comprise a second concentration of dopant higher than the first concentration of dopant.

The wordline and the contact plug may each be a second semiconductor pattern.

The semiconductor device may further include a first interlayer insulation layer disposed on the semiconductor substrate. The first interlayer insulation layer may be disposed below the wordline and the contact plug may extend through the first interlayer insulation layer.

The semiconductor device may further include a second interlayer insulation layer over the plurality of first semiconductor patterns. The node electrode may extend through the second interlayer insulating layer.

The semiconductor device may further include a third interlayer insulation layer over the phase change resistor and the second interlayer insulation layer. A bit line may be disposed on the third interlayer insulation layer and be electrically connected to the phase change resistor through the third interlayer insulation layer. A signal contact may be disposed on the third interlayer insulation layer and be electrically connected to the wordline through the second and third interlayer insulation layers. A second contact plug may be disposed on the third interlayer insulation layer and be electrically connected to the transistor through the first, second and third interlayer insulation layers.

According to another embodiment of the present invention, there is provided a method of fabricating a semiconductor memory device. The method includes sequentially forming a wordline and a low concentration semiconductor pattern on a semiconductor substrate. A node electrode is formed on the low concentration semiconductor pattern, and a Schottky diode is formed between the low concentration semiconductor pattern and the node electrode. A phase change resistor is formed on the node electrode.

The wordline may be a conductive layer containing metal and the method may further comprise forming a high concentration semiconductor pattern between the low concentration semiconductor pattern and the wordline.

A wordline conductive layer, a high concentration semiconductor layer, and a low concentration semiconductor layer may be formed in sequence on the semiconductor substrate, and the low concentration semiconductor layer, the high concentration semiconductor layer, and the wordline conductive layer are patterned in sequence to form the wordline, the high concentration semiconductor pattern, and the low concentration semiconductor pattern such that the high concentration semiconductor pattern and the low concentration semiconductor pattern extend along the wordline.

The wordline may be a high concentration semiconductor pattern.

A high concentration semiconductor layer and a low concentration semiconductor layer may be formed in sequence on the semiconductor substrate, and the low concentration semiconductor layer and the high concentration semiconductor layer may be patterned in sequence to form the low concentration semiconductor pattern on the high concentration semiconductor pattern such that the low concentration semiconductor pattern extends along the high concentration semiconductor pattern.

The method may further comprise forming a first interlayer insulation layer on the semiconductor substrate, prior to the forming of the wordline.

Prior to forming the phase change resistor, the method may further comprise forming a second interlayer insulation layer on the low concentration semiconductor pattern such that the second insulation layer covers the low concentration semiconductor pattern; forming a node contact hole, exposing a portion of the top surface of the low concentration semiconductor pattern, in the second interlayer insulation layer; and forming the node electrode to be located in the node contact hole.

The method may further comprise forming an insulation spacer on inner side surfaces of the node contact hole, prior to the forming of the node electrode.

Prior to forming the phase change resistor, the method may further comprise forming a silicide layer in the low concentration semiconductor pattern contacting the node electrode by performing a heat treatment on the semiconductor substrate on which the node electrode is formed.

According to the embodiments exemplarily described herein, forming the node electrode on the low concentration semiconductor pattern and forming the Schottky diode thereafter at an interface between the low concentration semiconductor pattern and the node electrode may reduce the operating voltage of the phase change memory device while improving the program efficiency of the phase change memory device. Also, since a natural oxide layer on the low concentration semiconductor pattern can be removed in situ when the node electrode is formed, an additional process to remove the natural oxide layers may not be necessary.

Also, the wordline below the low concentration semiconductor pattern is formed on the first interlayer insulation layer. Therefore, a junction leakage current and a junction capacitance between the semiconductor substrate and a dopant region may be eliminated in contrast to the case where the wordline is formed with the same material as the dopant region in the semiconductor substrate.

Moreover, the semiconductor pattern may extend along the wordline. In this case, voltage drop across the wordlines may be reduced. As a result, more cells can be connected to each of the wordlines, and thus the overall integration of phase change memory devices can be improved.

While embodiments of the present invention have been particularly shown and described above, it will be understood by one of ordinary skill in the art that various changes in form and details may be made therein without departing from the spirit and scope of the present invention as defined by the following claims.

What is claimed is:

1. A semiconductor memory device comprising:
a wordline extending along a direction on a semiconductor substrate;
a first semiconductor pattern disposed on the wordline;
a node electrode disposed on the first semiconductor pattern;
a Schottky diode formed between the first semiconductor pattern and the node electrode; and
a phase change resistor disposed on the node electrode,
wherein the wordline comprises a metal, the semiconductor memory device further comprising a second semiconductor pattern disposed between the first semiconductor pattern and the wordline.

2. The semiconductor memory device of claim 1, wherein the first semiconductor pattern comprises a first concentration of dopant and wherein the second semiconductor pattern comprises a second concentration of dopant higher than the first concentration of dopant.

3. The semiconductor memory device of claim 1, wherein the second semiconductor pattern and the first semiconductor pattern extend along the direction.

4. The semiconductor memory device of claim 1, wherein the first semiconductor pattern extends along the direction.

5. The semiconductor memory device of claim 1, further comprising a first interlayer insulation layer disposed on the semiconductor substrate, wherein the first interlayer insulation layer is disposed below the wordline.

6. The semiconductor memory device of claim 1, wherein a width of the node electrode is smaller than a width of the first semiconductor pattern.

7. The semiconductor memory device of claim 5, further comprising a second interlayer insulation layer disposed over the first semiconductor pattern, wherein a node contact hole is defined within the second interlayer insulation layer and exposes a portion of the top surface of the first semiconductor pattern, and wherein the node electrode is disposed in the node contact hole.

8. The semiconductor memory device of claim 7, further comprising an insulation spacer formed on inner side surfaces of the node contact hole, wherein the insulation spacer surrounds the node electrode.

9. The semiconductor memory device of claim 1, further comprising a silicide layer between the first semiconductor pattern and the node electrode.

10. A semiconductor device, comprising:
a semiconductor substrate including a cell array region and a peripheral circuit region; a transistor disposed within the peripheral circuit region;
a wordline disposed within the cell array region;
a first contact plug disposed within the peripheral circuit region and electrically connected to the transistor;
a plurality of first semiconductor patterns, wherein one of the plurality of first semiconductor patterns is disposed on the wordline and another one of the plurality of first semiconductor patterns is disposed on the contact plug;
a node electrode disposed within the cell array region and on the one of the plurality of first semiconductor patterns;
a Schottky diode formed between the one of the plurality of first semiconductor patterns and the node electrode; and
a phase change resistor disposed within the cell array region and on the node electrode.

11. The semiconductor device of claim 10, wherein the wordline and the first contact plug comprise a metal, the semiconductor device further comprising a plurality of second semiconductor patterns disposed between the plurality of first semiconductor patterns and corresponding ones of the wordline and contact plug.

12. The semiconductor device of claim 11, wherein the plurality of first semiconductor patterns comprises a first concentration of dopant and wherein the plurality of second semiconductor patterns comprises a second concentration of dopant higher than the first concentration of dopant.

13. The semiconductor device of claim 10, wherein the wordline and the contact plug are each a second semiconductor pattern.

14. The semiconductor device of claim 10, further comprising a first interlayer insulation layer disposed on the semiconductor substrate, wherein the first interlayer insulation layer is disposed below the wordline and wherein the contact plug extends through the first interlayer insulation layer.

15. The semiconductor device of claim 14, further comprising a second interlayer insulation layer over the plurality of first semiconductor patterns, wherein the node electrode extends through the second interlayer insulating layer.

16. The semiconductor device of claim 15, further comprising:
- a third interlayer insulation layer over the phase change resistor and the second interlayer insulation layer;
- a bit line on the third interlayer insulation layer and electrically connected to the phase change resistor through the third interlayer insulation layer;
- a signal contact on the third interlayer insulation layer and electrically connected to the wordline through the second and third interlayer insulation layers; and
- a second contact plug on the third interlayer insulation layer and electrically connected to the transistor through the first, second and third interlayer insulation layers.

17. A semiconductor memory device comprising:
- a wordline extending along a direction on a semiconductor substrate;
- a first semiconductor pattern disposed on the wordline;
- a second semiconductor pattern disposed between the first semiconductor pattern and the wordline;
- a node electrode disposed on the first semiconductor pattern;
- a Schottky diode formed between the first semiconductor pattern and the node electrode; and
- a phase change resistor disposed on the node electrode,
- wherein the first semiconductor pattern and second semiconductor pattern are directly connected to each other and extend along the direction.

18. The semiconductor memory device of claim 17, wherein the word line comprises a third semiconductor pattern.

* * * * *